United States Patent [19]
Tang

[11] Patent Number: 6,162,721
[45] Date of Patent: *Dec. 19, 2000

[54] SEMICONDUCTOR PROCESSING METHODS

[75] Inventor: Sanh Tang, Boise, Id.

[73] Assignee: Micron Technology, Inc., Boise, Id.

[*] Notice: This patent issued on a continued prosecution application filed under 37 CFR 1.53(d), and is subject to the twenty year patent term provisions of 35 U.S.C. 154(a)(2).

[21] Appl. No.: 09/183,486

[22] Filed: Oct. 30, 1998

Related U.S. Application Data

[63] Continuation of application No. 08/903,198, Jul. 15, 1997, Pat. No. 5,838,068, which is a continuation of application No. 08/672,305, Jun. 27, 1996, abandoned, which is a division of application No. 08/447,218, May 22, 1995, abandoned, which is a division of application No. 08/298,209, Aug. 29, 1994, Pat. No. 5,506,172.

[51] Int. Cl.$^7$ .................................................. H01L 21/44
[52] U.S. Cl. ........................... 438/634; 438/584; 438/592; 438/629; 438/630; 438/637
[58] Field of Search ..................................... 438/584, 592, 438/629, 630, 634, 637

[56] References Cited

U.S. PATENT DOCUMENTS

| | | |
|---|---|---|
| 4,176,003 | 11/1979 | Brower et al. . |
| 4,178,674 | 12/1979 | Liu et al. . |
| 4,240,196 | 12/1980 | Jacobs et al. . |
| 4,394,406 | 7/1983 | Gardiner et al. . |
| 4,516,147 | 5/1985 | Komatsu et al. . |
| 4,897,704 | 1/1990 | Sakurai . |
| 4,975,381 | 12/1990 | Taka et al. . |
| 5,126,231 | 6/1992 | Levy . |
| 5,162,259 | 11/1992 | Kolar et al. . |
| 5,219,793 | 6/1993 | Cooper et al. . |
| 5,243,220 | 9/1993 | Shibata et al. . |
| 5,292,676 | 3/1994 | Manning . |
| 5,326,713 | 7/1994 | Lee . |
| 5,358,903 | 10/1994 | Kim . |

FOREIGN PATENT DOCUMENTS

| | | |
|---|---|---|
| 57-109367 | 7/1982 | Japan . |
| 5-243933 | 12/1993 | Japan . |

*Primary Examiner*—Charles Bowers
*Assistant Examiner*—Lisa Kilday
*Attorney, Agent, or Firm*—Wells, St. John, Roberts, Gregory & Matkin, P.S.

[57] ABSTRACT

A semiconductor processing method includes: a) providing a substrate having a base region to which electrical connection is to be made; b) providing a first layer of a conductive first material; c) providing an etch stop layer over the first layer; d) etching a contact opening through the etch stop and first layers to the base region; e) providing a second layer of first material outwardly of the etch stop layer and within the contact opening to a thickness greater than the first layer thickness and extending outwardly beyond the contact opening upper edge; f) removing first material of the second layer and defining a second layer plug within the contact, the second layer plug having an outermost surface extending outwardly beyond the contact opening upper edge and thereby providing the second layer plug to be of greater thickness than the first layer; g) masking outwardly of the first layer and the second layer plug to define a mask pattern for definition of a circuit component from the first layer which connects with the base region through the second layer plug; and h) etching unmasked portions of the first layer and second layer plug to define a circuit component which connects with the base region through the second layer plug, the greater thickness of the second layer plug as compared to the thickness of the first layer restricting etching into the base region during etching. Integrated circuitry is also disclosed.

32 Claims, 7 Drawing Sheets

6,162,721

SEMICONDUCTOR PROCESSING METHODS

RELATED PATENT DATA

This patent resulted from a continuation application of U.S. patent application Ser. No. 08/903,198, which was filed on Jul. 15, 1997, now U.S. Pat. No. 5,838,068 entitled "Integrated Circuitry With Interconnection Pillar", which was a file wrapper continuation application of U.S. patent application Ser. No. 08/672,305, filed on Jun. 27, 1996, now abandoned which is a file wrapper continuation application of a divisional application of U.S. patent application Ser. No. 08/447,218, filed on May 22, 1995, now abandoned entitled "A Semiconductor Processing Method Of Forming An Electrical Interconnection Between An Outer Layer And An Inner Layer, and Integrated Circuitry", which was a divisional application of U.S. patent application Ser. No. 08/298,209, filed on Aug. 29, 1994 and which is now U.S. Pat. No. 5,506,172.

TECHNICAL FIELD

This invention relates generally to semiconductor processing methods of forming electrical interconnections between an outer layer and an inner layer, and to integrated circuitry.

BACKGROUND OF THE INVENTION

In semiconductor processing, one challenge is to assure precise alignment of all the various photomasks. Mask misalignment can result in wafer destruction at worst or render certain integrated circuitry useless at best. To accommodate for mask misalignment, safeguards are built into the processing.

One place in semiconductor processing where photomasks are utilized is in defining buried or other contacts in making electrical interconnection between an inner or lower region on a substrate to an outer or higher region. One example technique and the problems associated therewith are described with reference to FIGS. 1–5. FIG. 1 illustrates a semiconductor wafer fragment indicated generally by reference numeral 10. Such is comprised of a bulk substrate region 12, field oxide 14, and a gate oxide layer 16. An initially continuous thin layer 18 of polysilicon is deposited atop field oxide 14 and gate oxide 16. Thereafter, a buried contact opening 20 is provided through layers 18 and 16 to outwardly expose substrate 12 to which electrical interconnection is to be made.

Unfortunately, the outwardly exposed portion of substrate 12 is typically oxidized to provide an undesired insulating thin layer of oxide (not shown) atop the exposed substrate. This must be removed, and is typically accomplished by a blanket HF dip. The HF dip is typically conducted after all masking material has been removed and immediately prior to deposition of any subsequent layer. Were it not for protecting polysilicon layer 18, thin gate oxide layer 16 outside of buried contact 20 would also undesirably be etched during the dip. This would be undesirable as the degradation or removal of gate oxide is not practically controllable or predictable, thus requiring protective polysilicon layer 18.

A subsequent second and thicker layer 22 of an electrically conductive material, such as conductively doped polysilicon, is deposited to make electrical connection through buried contact 20 with substrate 12. This layer is then subjected to a masking step for purposes of patterning the combined polysilicon layers 22 and 18 into conductive lines or other circuit components which integrally connect with substrate 12 at contact opening 20.

FIGS. 2 and 3 illustrate an undesired misalignment of one of the masks for producing buried contact opening 20 or the line and component produced from layers 22 and 18. Range 20 represents the buried contact mask opening, while range 24 illustrates the mask utilized for producing a line or component 26. As is apparent, the etch utilized to produce component or line 26 is misaligned relative to buried contact 20 such that an over-etch 28 into bulk substrate 12 occurs, potentially destroying or rendering the wafer useless. To accommodate or allow for such inevitable misalignment, the target area where buried contact 20 and mask area 24 occur is enlarged, such as shown in FIGS. 4 and 5. A larger mask area range 24a is provided for producing what is commonly referred to as a buried contact enlarged cap 28. This provides for a degree of a relative inevitable misalignment for assuring 100% overlap of buried contact 20 relative to desired circuit component 26 such that over-etching into the substrate is prevented.

However, this undesirably creates additional problems of its own. More wafer real estate is consumed, thus decreasing desired circuit density. Further, such typically results in an additional implant step to assure desired circuit interconnection within substrate 12. FIG. 5 illustrates desired previously provided diffusion regions 30 and 32 within bulk substrate 12. A desired implant 34 was provided through contact opening 20 prior to deposition of polysilicon layer 22. Continuous electrical interconnection among regions 32, 34 and 30 is desired. To accommodate for this, a separate buried contact implanting step to provide interconnecting implants 36 and 38 must be conducted. This adds complexity and additional steps wherein the fragile wafers might be destroyed.

It would be desirable to overcome these and perhaps other problems associated with the prior art in developing a semiconductor processing method of forming an electrical interconnection between an outer layer and an inner layer.

BRIEF DESCRIPTION OF THE DRAWINGS

Preferred embodiments of the invention are described below with reference to the following accompanying drawings.

DETAILED DESCRIPTION OF THE PREFERRED EMBODIMENTS

Figure 1:
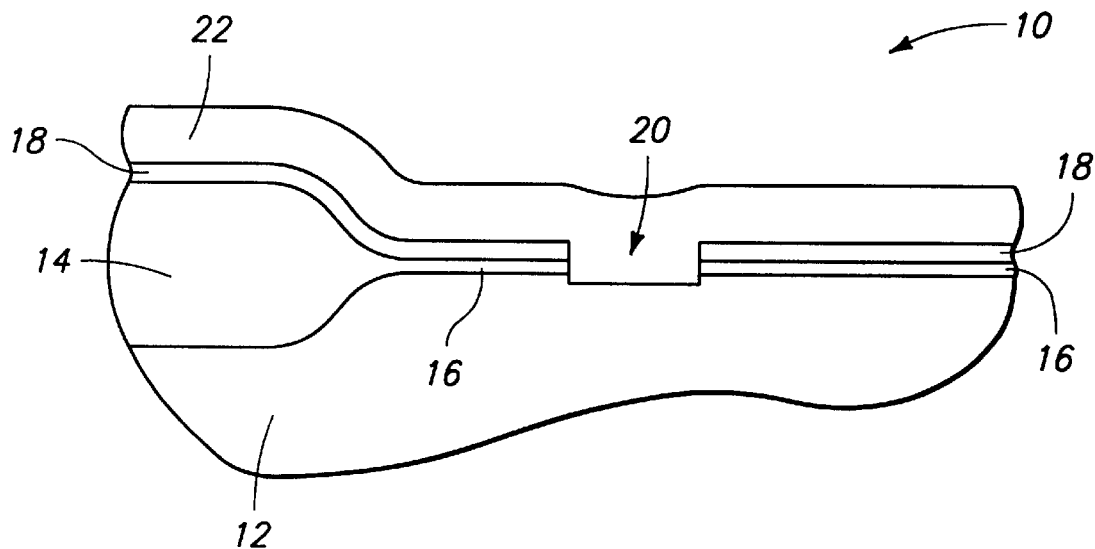
FIG. 1 is a diagrammatic sectional view of a prior art wafer fragment, and is discussed in the "Background" section above.
Figure 2:
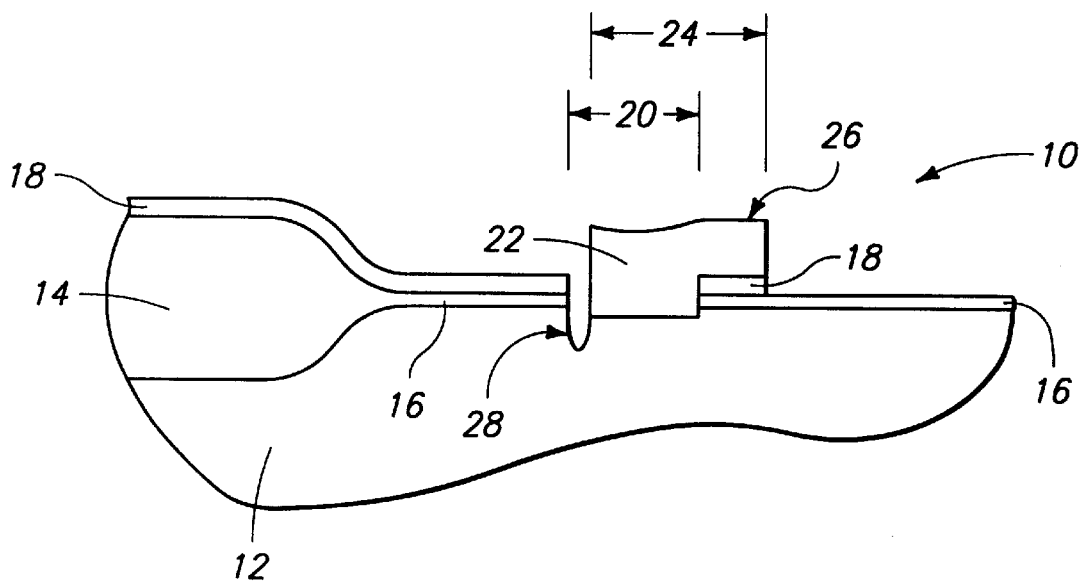
FIG. 2 is a view of the prior art FIG. 1 wafer fragment at a processing step subsequent to that shown by FIG. 1.
Figure 3:
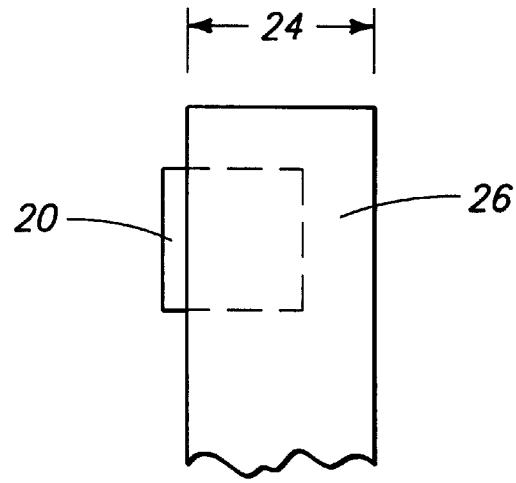
FIG. 3 is a top view of the FIG. 2 wafer fragment.
Figure 4:
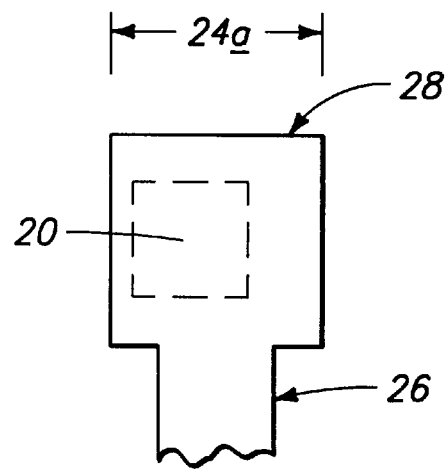
FIG. 4 is a top view of an alternate prior art embodiment wafer fragment.
Figure 5:
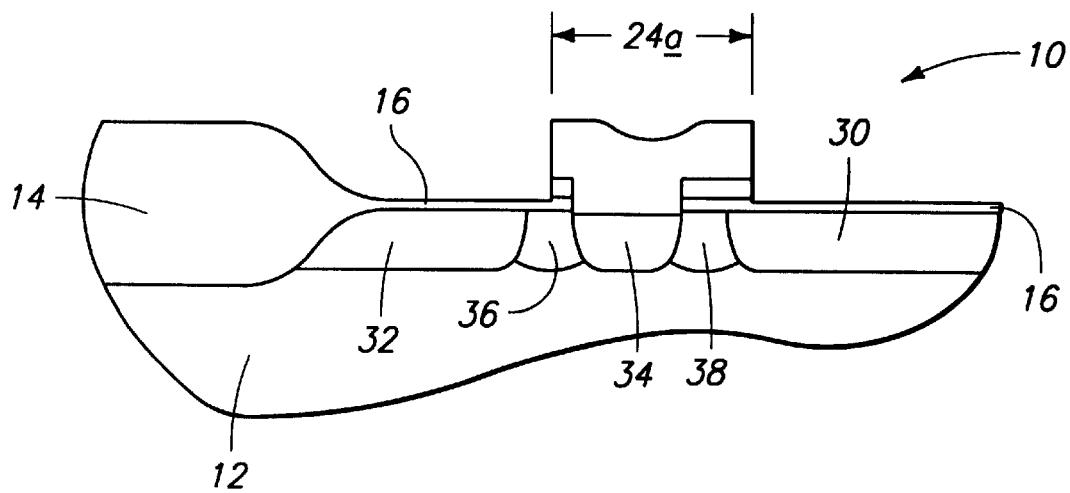
FIG. 5 is a diagrammatic section view of the prior art FIG. 4 wafer fragment.
Figure 6:
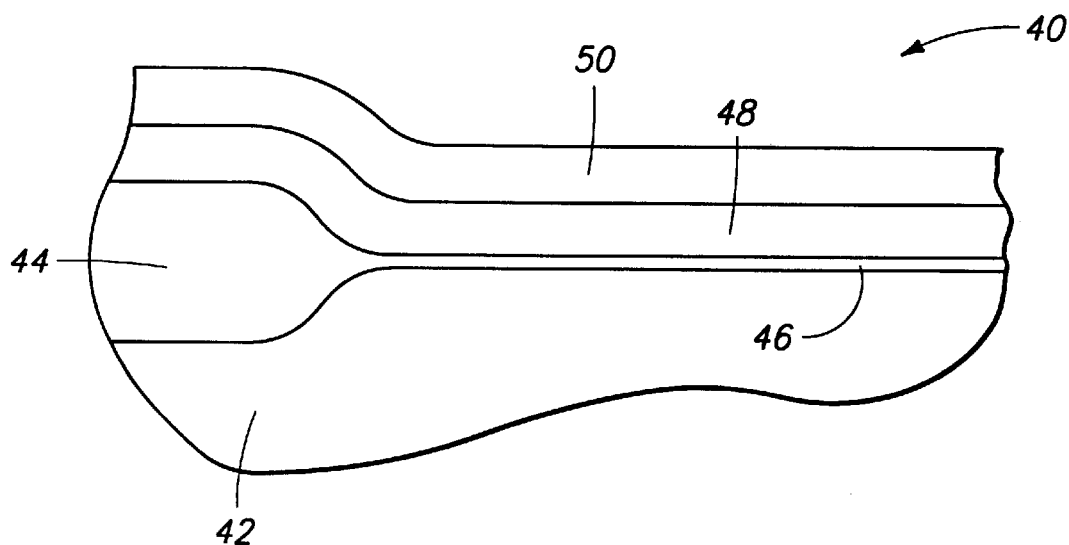
FIG. 6 is a diagrammatic section view of a semiconductor wafer fragment at one processing step in accordance with the invention.

This disclosure of the invention is submitted in furtherance of the constitutional purposes of the U.S. Patent Laws "to promote the progress of science and useful arts" (Article 1, Section 8).

In accordance with one aspect of the invention, a semiconductor processing method of forming an electrical interconnection between a base region and an outer layer comprises the following steps:

providing a substrate having a base region to which electrical connection is to be made;

providing a first layer of an electrically conductive first material over the substrate to a first thickness;

providing an etch stop layer over the first layer, the etch stop layer comprising a material to which the first material is selectively etchable;

etching a contact opening through the etch stop layer and first layer to the base region, the contact opening defining a contact opening upper edge of the first layer;

providing a second layer of the first material outwardly of the etch stop layer and within the contact opening to a second thickness, the second thickness being greater than the first thickness and the second layer extending outwardly beyond the first layer contact opening upper edge;

removing first material of the second layer and defining a second layer plug within the contact opening, the second layer plug having an outermost surface extending outwardly beyond the first layer contact opening upper edge and thereby providing the second layer plug to be of greater thickness than the first layer;

masking outwardly of the first layer and the second layer plug to define a mask pattern for definition of an electrically conductive circuit component from the first layer which connects with the base region through the second layer plug; and etching unmasked portions of the first layer and second layer plug to define an electrically conductive circuit component which connects with the base region through the second layer plug, the greater thickness of the second layer plug as compared to the thickness of the first layer restricting etching into the base region during etching.

In accordance with another aspect of the invention, an integrated circuit comprises:

a base region to which electrical interconnection is made;

an electrically conductive interconnection pillar extending from and outwardly of the base region, the pillar having an outermost surface; and an electrically conductive line extending from the pillar, the line having a joining outermost surface where it joins with the pillar, the pillar outermost surface being outwardly beyond the line joining outermost surface.

More particularly with reference to FIGS. 6–13, a semiconductor wafer fragment in accordance with the invention is indicated generally with reference numeral 40. Such is comprised of a bulk substrate 42 having field oxide 44 and associated gate oxide 46. Bulk substrate 42 typically and preferably comprises monocrystalline silicon. A first layer 48 of an electrically conductive first material is provided over field oxide 44 and gate oxide 46, and thus over the substrate, to a first thickness. An example preferred thickness is from 1,000 Angstroms to 4,000 Angstroms, with approximately 2,000 Angstroms being more preferred. An example and preferred material for layer 48 is conductively doped polysilicon. Other example electrically conductive materials would include silicides, such as $WSi_x$ and $TiSi_x$. An etch stop layer 50 is provided over first layer 48. Etch stop layer 50 comprises a material to which the first material is selectively etchable. An example and preferred material is silicon dioxide deposited by decomposition of tetraethylorthosilicate (TEOS). Alternate examples include phosphosilicate glass (PSG), spin-on-glass (SOG) and $Si_3N_4$. Preferably, the material of etch stop layer 50 is also selectively etchable relative to the first material. The preferred embodiment silicon dioxide and conductively doped polysilicon a re examples of two such materials which can be independently selectively etched relative to one another by techniques well known to people of skill in the art. A n example and preferred thickness for layer 50 is from 3,000 Angstroms to 4,000 Angstroms.

Figure 7:
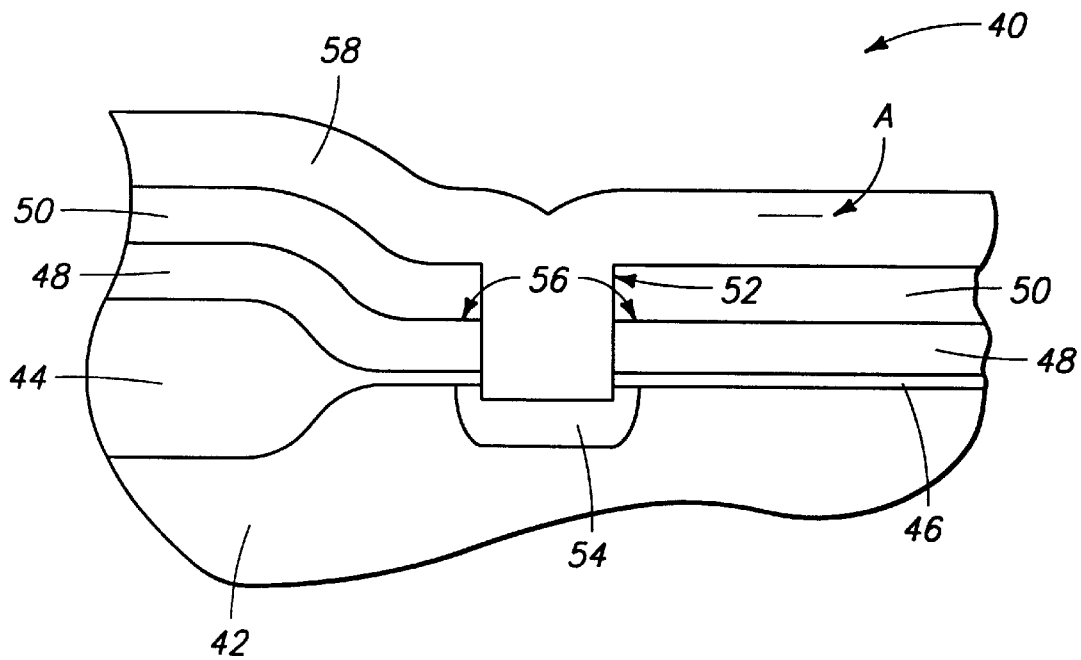
FIG. 7 is a view of the FIG. 6 wafer fragment at a processing step subsequent to that shown by FIG. 6.

Referring to FIG. 7, wafer fragment 40 is photomasked and etched to produce a contact opening 52 through etch stop layer 50 and first layer 48, and downwardly through gate oxide layer 46 to outwardly expose substrate 42. Doping with a conductivity enhancing impurity is then conducted through contact opening 52 to produce conductively doped region 54. Such comprises a base region to which electrical interconnection is to be made. For purposes of the continuing discussion, contact opening 52 defines a contact opening upper edge 56 of first layer 48.

A second layer 58 of the first material is deposited outwardly of etch stop layer 50 and within contact opening 52 to a second thickness. The second thickness is greater than the first thickness to provide second layer 58 extending outwardly to some local lowest elevation location "A" which is outwardly beyond first layer contact opening upper edge 56. An example preferred thickness of layer 58 is at least 30% greater than the radius of contact opening 52.

Figure 8:
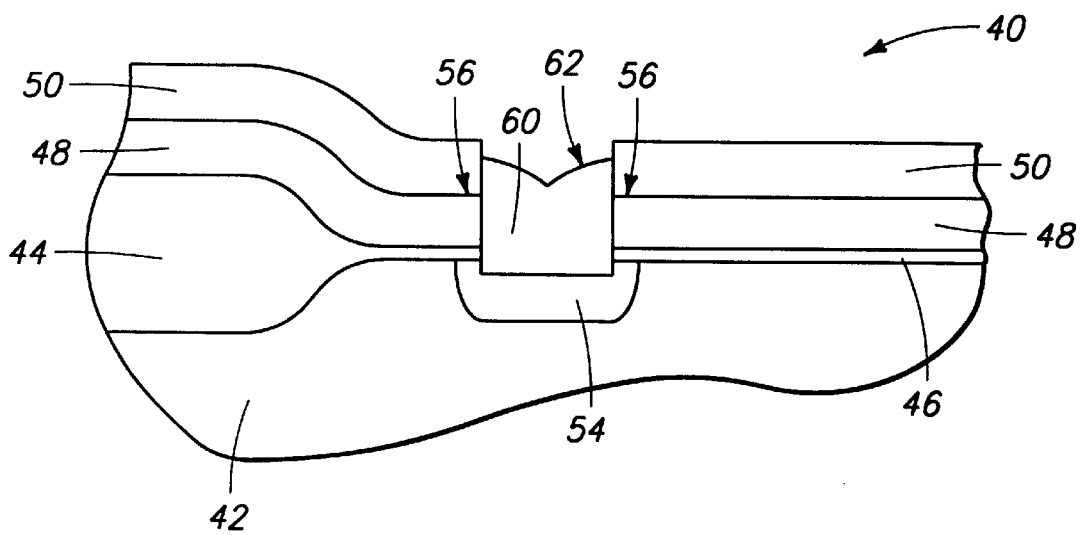
FIG. 8 is a view of the FIG. 6 wafer fragment at a processing step subsequent to that shown by FIG. 7.

Referring to FIG. 8, first material of second layer 58 is removed and a second layer plug 60 of the first material is defined within contact opening 52. An example and preferred technique is a timed dry etch utilizing reactive chlorine gas. The removal is conducted to define an outermost plug surface 62 which extends or is positioned outwardly beyond first layer contact opening upper edge 56. This thereby provides the second layer plug 60 to be of greater thickness than first layer 48. Alternately, plug 60 can be considered as an electrically conductive interconnection pillar extending from and outwardly of base region 54, and having an outermost surface 62. Preferably, the etch is conducted to remove all second layer 58 material from atop etch stop layer 50, such that plug 60 at this point in the process is entirely received within contact opening 52.

Figure 9:
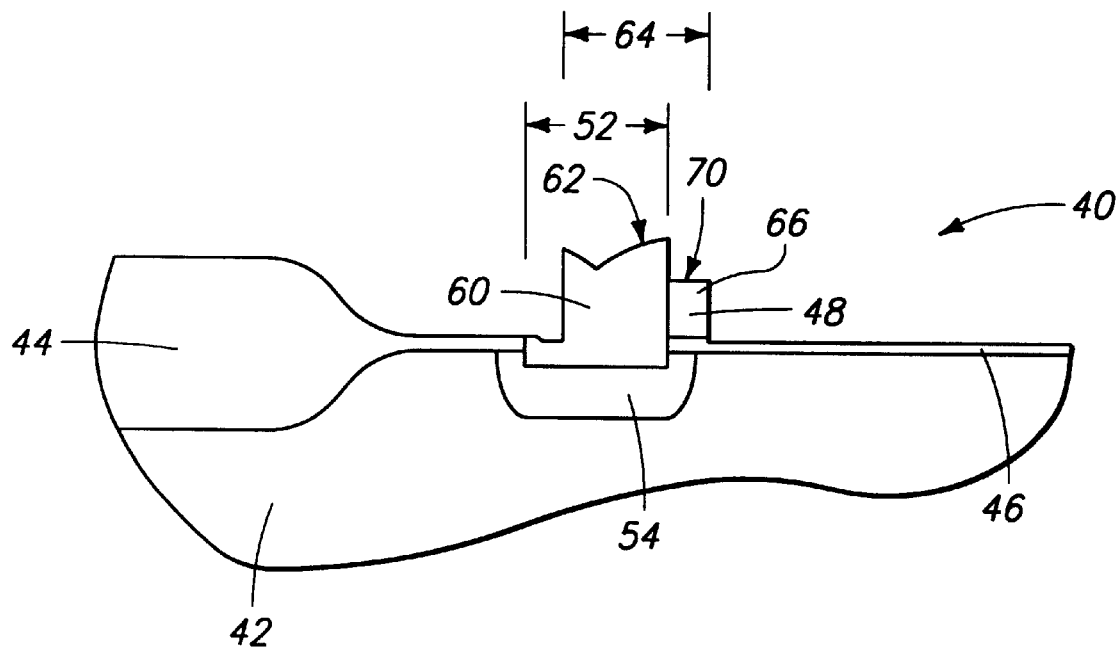
FIG. 9 is a view of the FIG. 6 wafer fragment at a processing step subsequent to that shown by FIG. 8.
Figure 10:
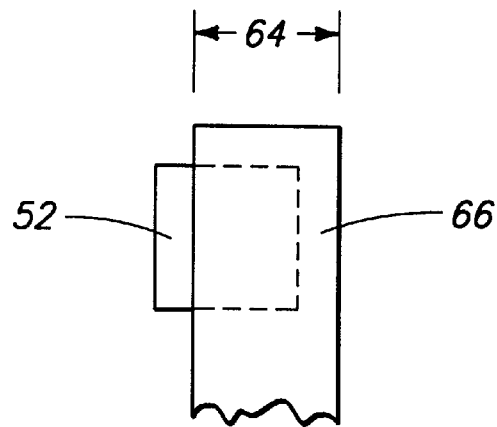
FIG. 10 is a top view of FIG. 9.

Referring to FIGS. 9 and 10, masking, is conducted outwardly of first layer 48 and second layer plug 60 to define a mask pattern 64 which will be utilized for definition of an electrically conductive circuit component, such as a conductive line 66, from first layer 48 which connects with base region 54 through second layer plug 60. Mask range 64 is purposely shown misaligned relative to buried contact 52 to illustrate the facility of the invention in accommodating for such misalignment. Prior to such masking, all of etch stop layer 50 would preferably be stripped from the substrate selectively relative to the first material of plug 60 and layer 48.

Unmasked portions of the etch stop layer (if any remains), first layer 48 and second layer plug 60 (due to misalignment) are then etched. This defines an electrically conductive circuit component, such as conductive line 66, which connects with base region 54 through second layer plug 60. Note that the greater thickness of second layer plug 60 as compared to the thickness of first layer 48 effectively restricts etching into the substrate or base region during such etching. This facilitates any inherent misalignment or effectively self-aligns the buried contact mask relative to component mask 64, thus enabling elimination of a buried contact cap (FIG. 10). Conductive line 66 extends outwardly from pillar 60, and has a joining outermost surface 70 where it joins with pillar 60. Pillar outermost surface 62 is positioned outwardly beyond joining outermost surface 70.

Figure 11:
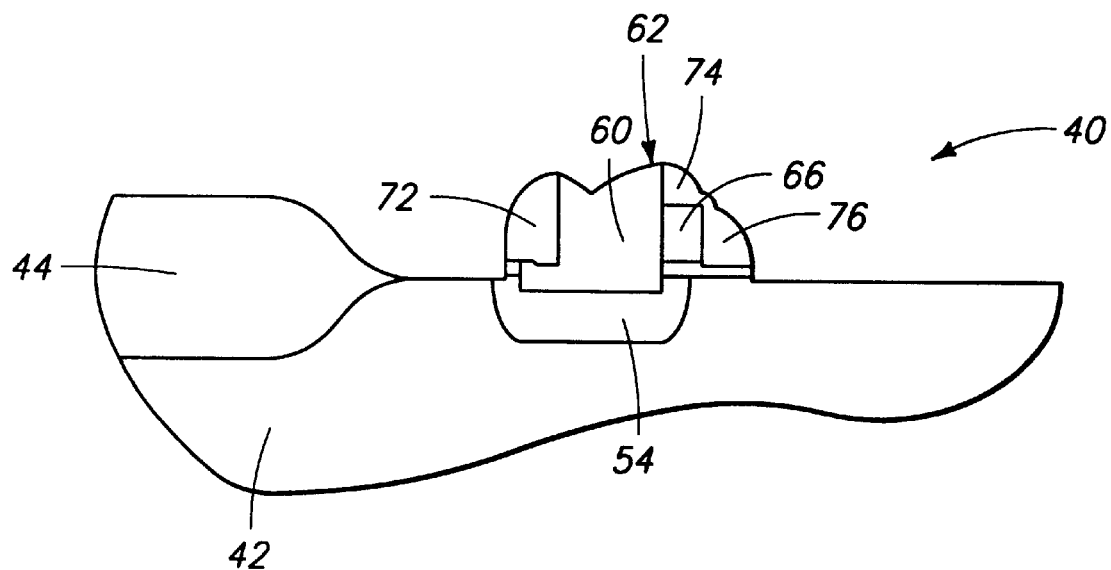
FIG. 11 is a view of the FIG. 6 wafer fragment at a processing step subsequent to that shown by FIG. 9.
Figure 12:
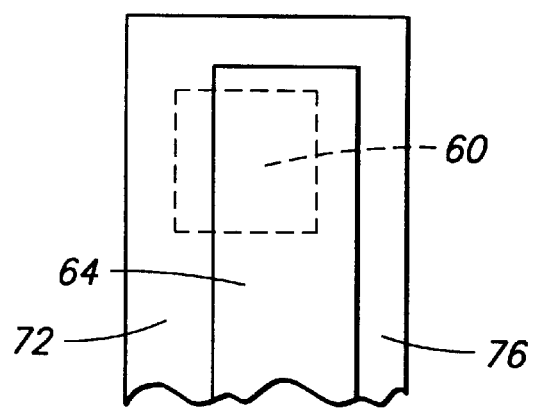
FIG. 12 is a top view of FIG. 11.

Referring to FIGS. 11 and 12, a suitable layer of oxide is provided and subjected to an anisotropic spacer etch to produce the illustrated spacers 72, 74, and 76. Alternately, plug 60 and line 66 might be capped with a higher conductive silicide material, such as $WSi_x$.

Figure 13:
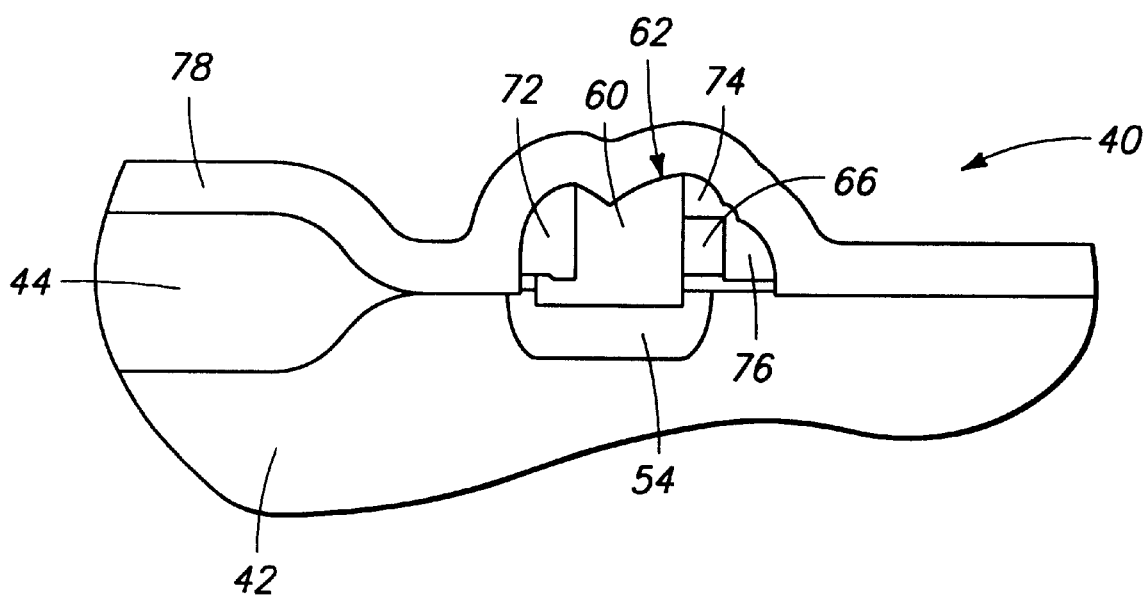
FIG. 13 is a view of the FIG. 6 wafer fragment at a processing step subsequent to that shown by FIG. 11.

Referring to FIG. 13, an insulating layer 78 (such as $SiO_2$) is provided to cap outermost surface 62 of pillar/plug 60.

In compliance with the statute, the invention has been described in language more or less specific as to structural and methodical features. It is to be understood, however, that the invention is not limited to the specific features shown and described, since the means herein disclosed comprise preferred forms of putting the invention into effect. The invention is, therefore, claimed in any of its forms or modifications within the proper scope of the appended claims appropriately interpreted in accordance with the doctrine of equivalents.

What is claimed is:

1. A semiconductor processing method of forming a connection between a base region and an outer layer, comprising:
   providing a substrate having a base region;
   forming a first layer of a first material over the substrate to a first thickness;
   forming an opening through the first layer to the base region;
   forming a second layer of a second material within the opening to a second thickness, the second thickness being greater than the first thickness;
   removing first material of the second layer and defining a second layer plug within the opening, the second layer plug having an outermost surface extending outwardly beyond the first layer;
   masking outwardly of the first layer and the second layer plug to define a common mask pattern for definition of a connection from the first and second layers which connects with the base region through the second layer plug; and
   removing unmasked portions of the first layer and the second layer plug using the common mask to define a connection which connects with the base region through the second layer plug, the greater thickness of the second layer plug as compared to the thickness of the first layer restricting penetration into the base region during the removing.

2. The semiconductor processing method of claim 1 wherein the first material comprises conductively doped polysilicon.

3. The semiconductor processing method of claim 1 wherein the first material and second material are the same as one another.

4. The semiconductor processing method of claim 1 wherein the first material and second material are the same as one another and conductive.

5. The semiconductor processing method of claim 1 wherein the first material and second material are the same as one another and comprise conductively doped polysilicon.

6. The semiconductor processing method of claim 1 further comprising providing an etch stop layer between the first layer and the second layer, the etch stop layer comprising a material to which the second material is selectively etchable.

7. The semiconductor processing method of claim 6 wherein the first material and second material are the same as one another.

8. The semiconductor processing method of claim 6 wherein the first material and second material are the same as one another and conductive.

9. The semiconductor processing method of claim 6 wherein the first material and second material are the same as one another and comprise conductively doped polysilicon.

10. The semiconductor processing method of claim 6 wherein the first material and second material are the same as one another and comprise conductively doped polysilicon, and wherein the etch stop layer comprises silicon dioxide.

11. The semiconductor processing method of claim 6 wherein the first material and second material are the same as one another and comprise conductively doped polysilicon, and wherein the etch stop layer material is insulative.

12. A semiconductor processing method of forming an electrical interconnection between a base region and an outer layer, comprising:
    providing a substrate having a base region;
    forming a first layer of an electrically conductive first material over the substrate to a first thickness;
    forming an opening through the first layer to the base region;
    forming a second layer of the first material within the opening to a second thickness, the second thickness being greater than the first thickness;
    removing first material of the second layer and defining a second layer plug within the opening, the second layer plug having an outermost surface extending outwardly beyond the first layer;
    masking outwardly of the first layer and the second layer plug to define a common mask pattern for definition of an electrically conductive circuit component from the first layer which connects with the base region through the second layer plug; and
    etching unmasked portions of the first layer and the second layer plug using the common mask to define an electrically conductive circuit component which connects with the base region through the second layer plug, the greater thickness of the second layer plug as compared to the thickness of the first layer restricting etching into the base region during etching.

13. The semiconductor processing method of claim 12 wherein the first material comprises conductively doped polysilicon.

14. The semiconductor processing method of claim 12 wherein the plug is received entirely within the contact opening.

15. The semiconductor processing method of claim 12 wherein the plug is received entirely within the contact opening, and the first material comprises conductively doped polysilicon.

16. The semiconductor processing method of claim 12 wherein the base region comprises a conductively doped region of monocrystalline silicon.

17. The semiconductor processing method of claim 12 wherein the base region comprises a conductively doped region of monocrystalline silicon, and the first material comprises conductively doped polysilicon.

18. A semiconductor processing method of forming an electrical interconnection between a base region and an outer layer, comprising:

providing a silicon substrate having a conductively doped base region to which electrical connection is to be made;

forming a first layer of an electrically conductive first material over the substrate to a first thickness;

forming an etch stop layer over the first layer, the etch stop layer comprising a material to which the first material is selectively etchable;

forming an opening through the etch stop layer and first layer to the base region, the opening defining an opening upper edge of the first layer;

providing a second layer of the first material outwardly of the etch stop layer and within the opening to a second thickness, the second thickness being greater than the first thickness and the second layer extending outwardly beyond the first layer opening upper edge;

removing first material of the second layer and defining a second layer plug within the opening, the second layer plug having an outermost surface extending outwardly beyond the first layer opening upper edge and thereby providing the second layer plug to be of greater thickness than the first layer;

masking outwardly of the first layer and the second layer plug to define a common mask pattern for definition of an electrically conductive circuit component from the first layer which connects with the base region through the second layer plug; and etching unmasked portions of the first layer and the second layer plug using the common mask to define an electrically conductive circuit component which connects with the base region through the second layer plug, the greater thickness of the second layer plug as compared to the thickness of the first layer restricting etching into the base region during etching.

19. The semiconductor processing method of claim 18 wherein the etch stop layer comprises a material which is selectively etchable relative to the first material, the etching step comprising etching all etch stop layer material from the substrate selectively relative to the first material prior to the masking step.

20. The semiconductor processing method of claim 18 wherein the first material comprises conductively doped polysilicon.

21. The semiconductor processing method of claim 18 wherein the etch stop layer is electrically insulative.

22. The semiconductor processing method of claim 18 wherein the etch stop layer is electrically conductive.

23. The semiconductor processing method of claim 18 wherein the etch stop layer material comprises silicon dioxide.

24. The semiconductor processing method of claim 18 wherein the first material comprises conductively doped polysilicon, and the etch stop layer material comprises silicon dioxide.

25. The semiconductor processing method of claim 18 wherein the plug is received entirely within the contact opening.

26. The semiconductor processing method of claim 18 wherein the plug is received entirely within the contact opening, and the first material comprises conductively doped polysilicon.

27. The semiconductor processing method of claim 18 wherein the plug is received entirely within the contact opening, and the etch stop layer material comprises silicon dioxide.

28. The semiconductor processing method of claim 18 wherein the plug is received entirely within the contact opening, the first material comprises conductively doped polysilicon, and the etch stop layer material comprises silicon dioxide.

29. The semiconductor processing method of claim 18 wherein the substrate comprises monocrystalline silicon.

30. The semiconductor processing method of claim 18 wherein the substrate comprises monocrystalline silicon, and the first material comprises conductively doped polysilicon.

31. The semiconductor processing method of claim 18 wherein the substrate comprises monocrystalline silicon, and the etch stop layer material comprises silicon dioxide.

32. The semiconductor processing method of claim 18 wherein the substrate comprises monocrystalline silicon, the first material comprises conductively doped polysilicon, and the etch stop layer material comprises silicon dioxide.

* * * * *

UNITED STATES PATENT AND TRADEMARK OFFICE
CERTIFICATE OF CORRECTION

PATENT NO : 6,162,721
DATED : December 19, 2000
INVENTOR(S) : Sanh D. Tang

It is certified that error appears in the above-identified patent and that said Letters Patent are hereby corrected as shown below:

Col. 4, line 19
  replace "a re"
  with --are--.
Col. 4, line 21
  replace "A n"
  with --An--.
Col. 4, line 56 please delete the "," after masking.

Signed and Sealed this

First Day of May, 2001

NICHOLAS P. GODICI

*Attest:*

*Attesting Officer*   Acting Director of the United States Patent and Trademark Office